United States Patent
An et al.

(10) Patent No.: US 9,455,740 B2
(45) Date of Patent: Sep. 27, 2016

(54) DATA COMPRESSION APPARATUS AND METHOD

(71) Applicant: TIBERO Co., Ltd., Gyeonggi-do (KR)

(72) Inventors: Jae Seok An, Gyeonggi-do (KR); Sang Young Park, Gyeonggi-do (KR)

(73) Assignee: TmaxData Co., Ltd, Seongnam-si (KR)

( * ) Notice: Subject to any disclaimer, the term of this patent is extended or adjusted under 35 U.S.C. 154(b) by 675 days.

(21) Appl. No.: 13/669,689

(22) Filed: Nov. 6, 2012

(65) Prior Publication Data

US 2014/0114938 A1    Apr. 24, 2014

(30) Foreign Application Priority Data

Oct. 22, 2012 (KR) .................. 10-2012-0117519

(51) Int. Cl.
*H03M 7/30* (2006.01)
*G06F 17/30* (2006.01)

(52) U.S. Cl.
CPC .......... *H03M 7/30* (2013.01); *G06F 17/30595* (2013.01); *G06F 17/30315* (2013.01)

(58) Field of Classification Search
None
See application file for complete search history.

(56) References Cited

U.S. PATENT DOCUMENTS

| | | | |
|---|---|---|---|
| 7,103,608 B1* | 9/2006 | Ozbutun et al. | 707/604 |
| 7,548,928 B1* | 6/2009 | Dean et al. | |
| 2008/0294676 A1* | 11/2008 | Faerber et al. | 707/102 |
| 2009/0070543 A1* | 3/2009 | Oh | H03M 7/3086 711/170 |
| 2009/0313277 A1* | 12/2009 | Rissman | 707/101 |
| 2010/0036862 A1* | 2/2010 | Das et al. | 707/101 |
| 2010/0082545 A1* | 4/2010 | Bhattacharjee et al. | 707/641 |
| 2010/0121826 A1* | 5/2010 | Mitsuhashi | 707/693 |
| 2010/0281004 A1* | 11/2010 | Kapoor et al. | 707/693 |
| 2011/0219357 A1* | 9/2011 | Livshits et al. | 717/115 |
| 2012/0296881 A1* | 11/2012 | Christian et al. | 707/693 |

* cited by examiner

*Primary Examiner* — James Trujillo
*Assistant Examiner* — Aida Tessema
(74) *Attorney, Agent, or Firm* — Bacon & Thomas, PLLC (57) ABSTRACT

A data compression apparatus generates a global symbol table for an overlapping data using a part of the entire data to be compressed and a local symbol table that is not overlapped with the global symbol table and compressing data with a block as a unit. The apparatus increase compression efficiency.

18 Claims, 5 Drawing Sheets

DATA COMPRESSION APPARATUS AND METHOD

CROSS-REFERENCE TO RELATED APPLICATION(S)

The present invention claims priority of Korean Patent Application No. 10-2012-0117519, filed on Oct. 22, 2012, which is incorporated herein by reference.

FIELD OF THE INVENTION

The present invention relates to a data compression apparatus and method. More specifically, the invention relates to a data compression apparatus and method, capable of generating a global symbol table for an overlapping data using a part of the entire data to be compressed and a local symbol table that is not overlapped with the global symbol table and compressing data with a block as a unit, thereby increasing compression efficiency.

Support for the present invention was provided by Ministry of Knowledge Economy in Korea under Project 10040937 [Source Technology Development Business for Industrial Convergence].

BACKGROUND OF THE INVENTION

Data compression is a technology to efficiently store data in a smaller storage space. For this, a technology to apply a specific algorithm to original data and generate compressed data together with information to identify the kind of the compression algorithm is widely used. Generally, the technology to generate such compressed data is provided from a database management system such as Oracle, SQL-server and DB2. Such a database management system forms particular columns of the data table having a high occurrence frequency as a symbol table by assigning a symbol, for example, a number or a character to each of the columns, and compresses the columns using the symbol table.

SUMMARY OF THE INVENTION

There is a data compression method that is one of the conventional compression methods, wherein the entire columns of the data table is loaded and a symbol table for the entire the columns is generated. In this case, there occurs a problem that compression efficiency is reduced since it is not possible to compress an overlapping column occurring newly after the symbol table is generated.

Further, there is another data compression method, wherein when a column having a fixed size among the entire columns is loaded, a symbol table for the column is generated and data is compressed with a block. In this case, there occurs a problem that compression efficiency is reduced since an overlapping column is stored in all symbol tables of many blocks even when the overlapping column occurring in a block exists in many blocks.

In view of the above, the present invention provides a data compression apparatus and a data compression method, capable of increasing compression efficiency even when new data column is inserted into the data table to be compressed or an overlapping column occurring in a block exists in many blocks.

In accordance with a first aspect of the present invention, there is provided a data compression apparatus, comprising: a global symbol table generation unit configured to search for columns as the predetermined size of a reference block among original columns of a data table and select a global target for compression, and generate a global symbol table corresponding to the global target, a local symbol table generation unit configured to search for an overlapping original column whenever the original column is input and select the overlapping original column as a local target for compression, and generate a local symbol table corresponding to the local target, and a data compression unit configured to generate global compressed data or local compressed data by compressing the original column corresponding to the global symbol table or the local symbol table, and generate at least a compressed block having a predetermined size, wherein the original column selected for the local target is different from the original column selected for the global target.

The data compression unit generates the local compressed data by compressing the original column corresponding to the local symbol table before the global symbol table is completed. The data compression unit determines whether the size of the block becomes larger than the predetermined size whenever the original column is input and generates compressed block.

The data compression unit generates the local compressed data or global compressed data corresponding to the original column input until now as the compressed block, when the size of the block becomes larger than the predetermined size.

Further, the global symbol data generating unit comprises: a global buffer for storing the original column temporally, a global data pattern search unit configured to search for an occurrence frequency of the original column stored temporally, extract an overlapping original column and select the global target, and a global symbol assignment unit configured to assign global symbol to the global target.

The global data pattern search unit selects the global target according to the length and occurrence frequency of the overlapping original column.

Further, the local symbol table generating unit comprises: a local buffer for storing the original column, a local data pattern search unit configured to search for an occurrence frequency of the original column stored temporally, extract an overlapping original column and select the local target, and a local assignment unit configured to assign local symbol to the local target.

The local data pattern unit excludes the original column selected as the global target from the local target when the global symbol table is completed. The local data pattern search unit updates the local target whenever the original column is input.

The predetermined size of the reference block is larger than that of the compressed block. The local symbol table is stored in the compressed block. The global symbol table is stored in a space separated from the space where the global compressed data and local compressed data are stored.

In accordance with a second aspect of the present invention, there is provided a data compression method, comprising: loading original columns of a data table, selecting a global target for as much original columns as a predetermined size of the reference block, determining whether a global symbol table for the global target was completed, selecting a local target different from the global target when the global symbol table was completed, generating a local symbol table corresponding to the local target, generating a global compressed data or local compressed data by compressing the original column according to the global symbol table and the local symbol table, and generating a compressed block by storing the original column, the global compressed data or the local compressed data as much as the predetermined size of the block.

Further, the data compression method comprising: searching for the original columns and selecting an overlapping original column as the local target, in case that the global symbol table was not generated in determining whether the global symbol table was completed.

Further, the data compression method comprising: generating a local compressed data by compressing the original column according to the local symbol table in case that the global symbol table was not completed. The generating the compressed block comprises determining whether the size of the block becomes larger than the predetermined size whenever the original column is input.

Further, the data compression method comprising: generating the local compressed data or the global compressed data corresponding to the original column input until now as the compressed block in case that the size of the block becomes larger than the predetermined size in determining whether the size of the block stored. The selecting the local target comprises updating the local target whenever the original column is input.

As described above, in accordance with embodiments of the present invention, it provides an effect in that a global symbol table for an overlapping data is generated using a part of the entire data to be compressed and a local symbol table that is not overlapped with the global symbol table is generated, so that the data is compressed with a block as a unit, thereby increasing compression efficiency.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings so that they can be readily implemented by those skilled in the art.

Figure 1:
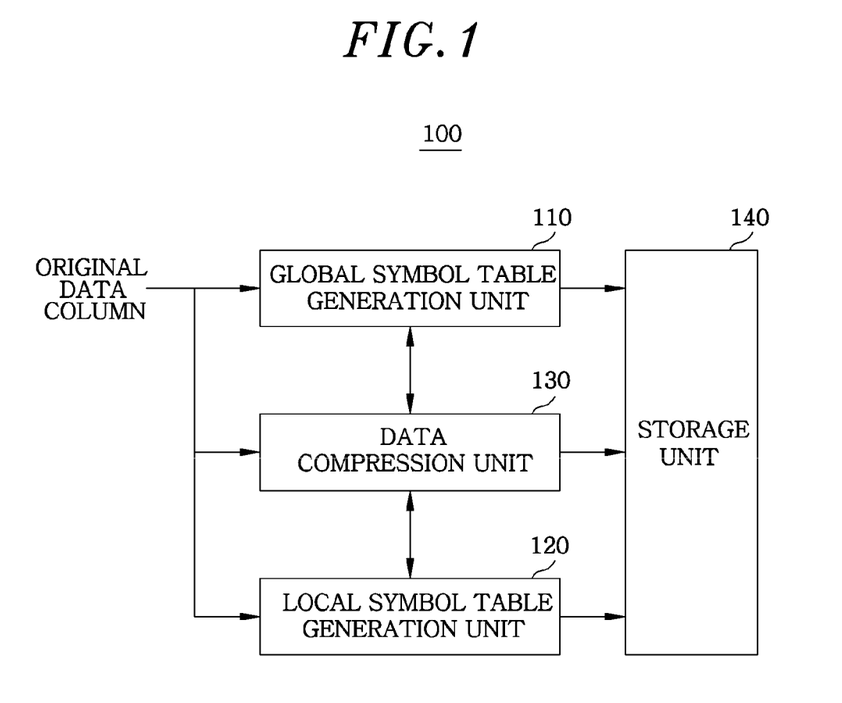
FIG. 1 is a block diagram illustrating a data compression apparatus according to an embodiment of the present invention.

FIG. 1 is a block diagram illustrating a data compression apparatus according to an embodiment of the present invention.

Referring to FIG. 1, a data compression apparatus 100 according to the present invention includes a global symbol table generation unit 110, a local symbol table generation unit 120, a data compression unit 130 and a storage unit 140. The global symbol table generation unit 110 selects a global target by searching original columns of the data table for at least an overlapping column with a predetermined size of a reference block, and generates a global symbol table corresponding to the overlapping column of the global target.

The local symbol table generation unit 120 selects a local target by searching original columns of the data table for at least an overlapping column until the columns is compressed into a block having a predetermined size, and generates a local symbol table corresponding to the overlapping column of the local target. Here, it is preferred that the overlapping column of the local target according to an embodiment of the present invention differs from the overlapping column of the global target.

The data compression unit 130 dynamically compress the original columns according to whether the global symbol table is completed to generate a compressed block. The compressed block is then stored in the storage unit 140. In more detail, the data compression unit 130 generates determination data for compression using the global symbol table and local symbol table, and generates a compressed block including the original column, local compressed data or global compressed data based on the determination data. Here, the determination data includes selection information to select whether the original column was compressed and size information to determine compression size of the original column accumulated until now.

Figure 2:
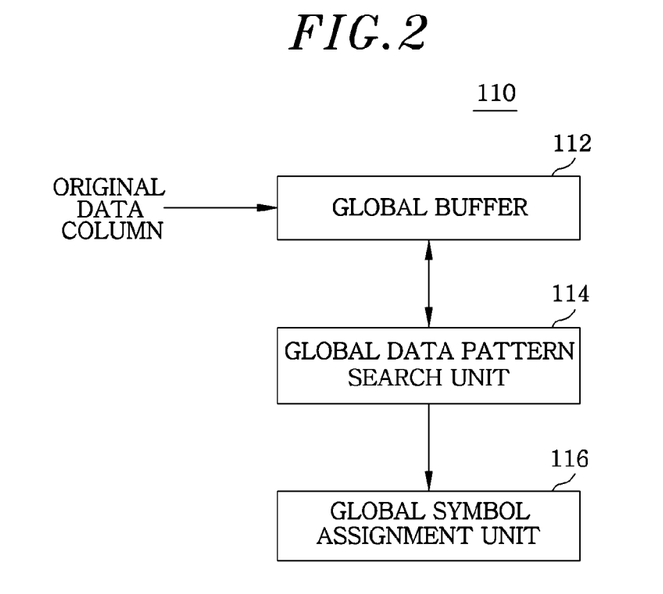
FIG. 2 is a detailed block diagram illustrating a global symbol table shown in FIG. 1.

FIG. 2 is a detailed block diagram illustrating the global symbol table shown in FIG. 1.

Referring to FIG. 2, the global symbol table generation unit 110 includes a global buffer 112, a global data pattern search unit 114 and a global symbol assignment unit 116. The global buffer 112 serves to temporally store original columns input in order.

The global data pattern search unit 114 searches for an occurrence frequency of an original column input through the global butter 112 and extracts at least an overlapping column. The global data pattern search unit 114 selects at least a global target according to length and occurrence frequency of the overlapping column.

To put it concretely, the global data pattern search unit 114 selects N-columns as global target in the order of length and occurrence frequency of the overlapping column. Here, it is preferred that the global data pattern search unit 114 divides the entire original columns into one or more reference blocks and extracts the overlapping column in each reference block.

For example, in case that the entire original columns have 10 G bytes in size, the global data pattern search unit 114 selects the global target by searching for original columns of 10M byte. For this, the global data pattern search unit 114 deletes the columns that occurrence frequency is low among the overlapping column from the global buffer 112 and provides an available (data) space to store a next original column in the global buffer 112.

The global symbol assignment unit 116 assigns global symbols such as number and character to the overlapping column selected as the global target to complete the global symbol table, which will then be stored in the storage unit 140.

Figure 3:
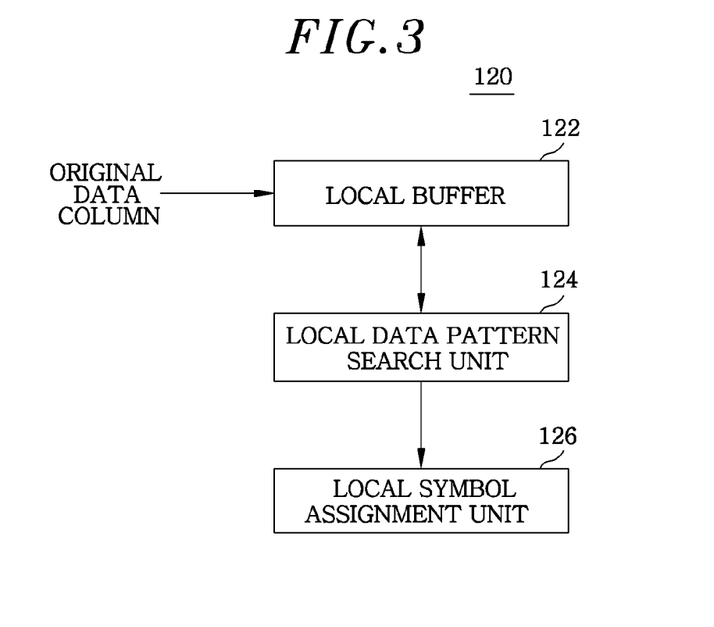
FIG. 3 is a detailed block diagram illustrating a local symbol table shown in FIG. 1.

FIG. 3 is a detailed block diagram illustrating a local symbol table shown in FIG. 1.

Referring to FIG. 3, a local symbol table generation unit 120 includes a local buffer 122, a local data pattern search unit 124, and a local symbol assignment unit 126. The local buffer 122 temporally stores original columns input in order.

The local data pattern search unit 124 extracts at least an overlapping column from the original columns input through the local buffer 122 and selects at least a local target. Further, the local data pattern search unit 124 determines length and occurrence frequency of the overlapping column to update the local target whenever the original column input to the local buffer 122.

According to the embodiments, it is preferred that the local data pattern search unit 124 selects local target depending upon whether the global symbol table was completed. More specifically, the local data pattern search unit 124 selects local target excluding original column of the global target in case that the global symbol table was completed. Accordingly, it is prevented that each of columns stored in the global symbol table and that stored in the local symbol table are overlapped.

The local symbol assignment unit 126 assigns local symbols such as number and character to the overlapping column selected as local target and generates a local symbol table. Here, it is preferred that the local symbol table is updated whenever the local target is updated.

Figure 4:
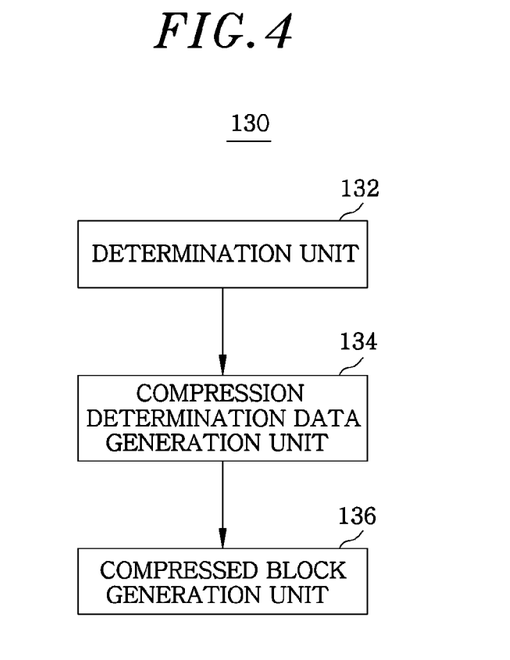
FIG. 4 is a detailed block diagram illustrating a data compression unit shown in FIG. 1.

FIG. 4 is a detailed block diagram illustrating the data compression unit shown in FIG. 1.

Referring to FIG. 4, the data compression unit 130 according to an embodiment of the present invention includes a determination unit 132, a compression determination data generation unit 134 and a compressed block generation unit 136.

The determination unit 132 determines information on the global symbol table. The determination unit 132 determine whether there exists the global symbol table and requests the global symbol table generation unit 110 to generate a global symbol table in case that the global symbol table does not exist. Further, the determination unit 132 determines whether the global symbol table was completed in case that the global symbol table exists. The determination unit 132 transfers information indicating the completion of the global symbol table to the local symbol table generation unit 120 and the compression determination data generation unit 134 when it is determined that the global symbol table was completed.

The compression determination data generation unit 134 generates determination data using the local symbol table and global symbol table. To put it concretely, the determination data generation unit 134 expects the size of the original data column to which the local symbol table or the global symbol table is applied for data compression thereof. As a result of the expectation, when the size of the compressed data becomes larger than that of the data before being compressed, the compression determination data generation unit 134 generates selection information indicating that the original column needs to be remained. However, when the size of the data becomes smaller than that of the data before being compressed, it generates selection information indicating that the original column needs to be compressed.

Further, the compression determination data generation unit 134 compares the size of expected entire data to be compressed for the accumulated original column with a predetermined size of the compressed block using the selection information and generates information on the size. In this case, it is preferred that the size of predetermined size of compressed block is smaller than that of a reference block. For example, when the reference block is 10M byte in size, the compressed block is set as 8K byte in size.

When the size of the expected entire data of the original column to be compressed according to the compression determination data is identical to predetermined size of compressed block, the compressed block generation unit 136 compresses the original column input until now in the format of the local compressed data or global compressed data, generates a compressed block and stores it in the storage unit 140.

Further, the compressed block generation unit 136 stores a finally updated local symbol table in the storage unit 140 whenever the compressed block is generated. Here, it is preferred that the local symbol table is stored in the relevant +compressed block. Meanwhile, it is preferred that the global symbol table is independently stored in an available space of the storage unit 140 that is a separate space where the compressed block is stored.

Hereinafter, a data compression method according to an embodiment of the present invention is described as follows.

Figure 5:
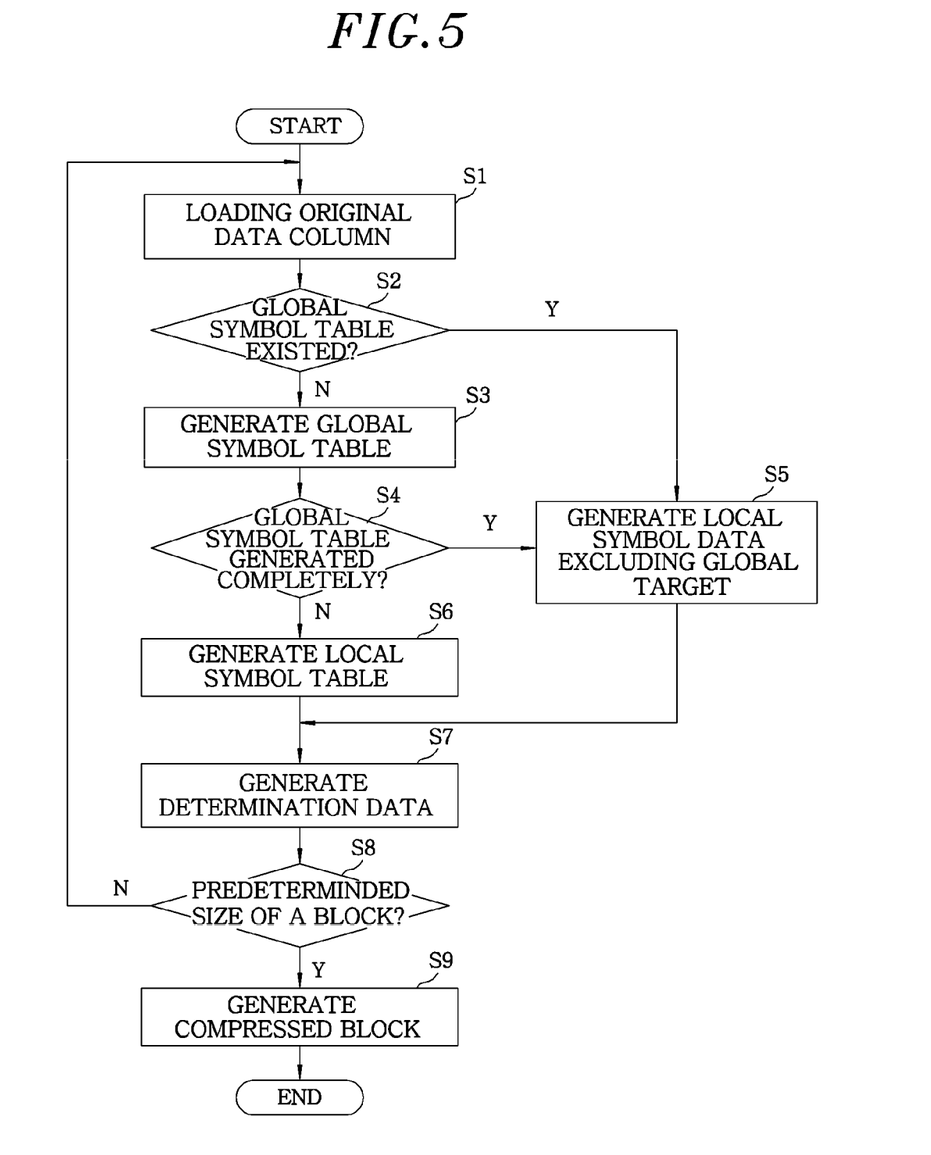
FIG. 5 is a flow chart illustrating a data compression method according to an embodiment of the present invention.

FIG. 5 is a flow chart illustrating a data compression method according to an embodiment of the present invention.

Referring to FIG. 5, original columns of the data table is loaded and sequentially stored in the global buffer 112 and local buffer 122 temporally in operation S1. Next, in operation S2, the determination unit 136 determines whether there exists a global symbol table. As a result of the determination, it is determined that the global symbol table does not exist, the determination unit 136 requests the global symbol table generation unit 110 to generate a global symbol table.

Then, the global data pattern search unit 114 extracts an overlapping original column corresponding to the size of the predetermined reference block and selects a global target. In operation S3, the global symbol assignment unit 116 assigns a global symbol to an original column selected as the global target and generates a global symbol table.

As such, the determination unit 136 continues to determine whether the global symbol table is completed while the global symbol table is generated in operation S4. As a result of the determination, when the global symbol table is completed, the determination unit 136 transfers information indicating that the global symbol table is completely generated to the local symbol table generation unit 120. Then, the local data pattern search unit 124 searches for the overlapping original column and selects a local target whenever the overlapping column excluding the overlapping column existing in the global symbol table is input. Next, the local symbol assignment unit 126 assigns a local symbol to the overlapping column selected as the local target and generates a local symbol table in operation S5.

On the contrary, when the global symbol table was not completed as a result of the determination in operation S4, the local data pattern search unit 124 searches for an overlapping original column and selects a local target whenever the original column is input. Further, the local symbol assignment unit 126 assigns a local symbol to the overlapping column selected as the local target and generates a local symbol table in operation S6.

Next, the compression determination data generation unit 134 generates compression determination data using the global symbol table or local symbol table in operation S7. Next, the compressed block generation unit 136 determines whether the size of the expected entire data of the original column to be compressed according to the compression determination data becomes larger than the predetermined size of the compressed block in operation S8. As a result of the determination, when the size of the expected entire data is smaller than the predetermined size of compressed block, the original column of next order is continuously input.

On the contrary, when the size of the expected entire data is larger than the predetermined size of compressed block, the local compressed data or global compressed data corresponding to the original column input until now is gathered to generate a compressed block. Further, the generated compressed block is stored in the storage unit 140 in operation S9. At this time, the local symbol table updated until now is stored in the relevant compressed block.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A data compression apparatus, comprising:
a global symbol table generation unit configured to divide original columns of a data table into reference blocks of a predetermined size, select a first overlapping original column extracted from each of the reference blocks as a global target for compression, and generate a global symbol table corresponding to the global target, wherein the global target is not updated after the global symbol table generation unit finishes generating the global symbol table, even if an original column is newly input:
a local symbol table generation unit configured to search for a second overlapping original column whenever an original column is input, select the second overlapping original column as a local target for compression, and generate a local symbol table corresponding to the local target, wherein the local target is updated whenever an original column is input: and
a data compression unit configured to generate global compressed data or local compressed data by compressing the overlapping original column corresponding to the global symbol table or the local symbol table, and generate at least a compressed block having a predetermined size, wherein the second overlapping original column selected for the local target is different from the first overlapping original column selected for the global target;
wherein the local symbol table generation unit excludes the first overlapping original column selected as the global target from the local target when the global symbol table is completed.

2. The data compression apparatus of claim 1, wherein the data compression unit generates the local compressed data by compressing the original column corresponding to the local symbol table before the global symbol table is completed.

3. The data compression apparatus of claim 1, wherein the data compression unit determines whether the size of the block becomes larger than the predetermined size whenever the original column is input and generates compressed block.

4. The data compression apparatus of claim 3, wherein the data compression unit generates the local compressed data or global compressed data corresponding to the original column input until now as the compressed block, when the size of the block becomes larger than the predetermined size.

5. The data compression apparatus of claim 1, wherein the global symbol data generating unit comprises:
a global buffer for storing the original column temporally;
a global data pattern search unit configured to search for an occurrence frequency of the original column stored temporally, extract an overlapping original column and select the global target; and
a global symbol assignment unit configured to assign global symbol to the global target.

6. The data compression apparatus of claim 5, wherein the global data pattern search unit selects the global target according to the length and occurrence frequency of the overlapping original column.

7. The data compression apparatus of claim 1, wherein the local symbol table generating unit comprises:
a local buffer for storing the original column; a local data pattern search unit configured to search for an occurrence frequency of the original column stored temporally, extract an overlapping original column and select the local target; and
a local assignment unit configured to assign local symbol to the local target.

8. The data compression apparatus of claim 7, wherein the local data pattern unit excludes the original column selected as the global target from the local target when the global symbol table is completed.

9. The data compression apparatus of claim 7, wherein the local data pattern search unit updates the local target whenever the original column is input.

10. The data compression apparatus of claim 1, wherein the predetermined size of the reference block is larger than that of the compressed block.

11. The data compression apparatus of claim 1, wherein the local symbol table is stored in the compressed block.

12. The data compression apparatus of claim 11, wherein the global symbol table is stored in a space separated from the space where the global compressed data and local compressed data are stored.

13. A data compression method, comprising:
loading original columns of a data table;
dividing original columns of the data table into reference blocks of a predetermined size and selecting a first overlapping original column extracted from each of the reference blocks as a global target of compression;
generating a global symbol table corresponding to the global target;
wherein the global target is not updated after the global symbol table is finished being generated, even if an original column is newly input; and
searching for a second overlapping original column whenever an original column is input and selecting the second overlapping original column as a local target for compression;
generating a local symbol table corresponding to the local target, wherein the local target is updated whenever an original column is input;
generating a global compressed data or local compressed data by compressing the overlapping original column corresponding to the global symbol table or the local symbol table; and
generating at least a compressed block having a predetermined size, wherein the second overlapping original column selected for the local target is different from the first overlapping original column selected for the global target;
wherein the first overlapping original column selected as the global target is excluded from the local target when the global symbol table is completed.

14. The data compression method of claim 13, further comprising:
searching for the original columns and selecting an overlapping original column as the local target, in case that the global symbol table was not generated in determining whether the global symbol table was completed.

15. The data compression method of claim 14, further comprising:

generating a local compressed data by compressing the original column according to the local symbol table in case that the global symbol table was not completed.

16. The data compression method of claim 13, wherein the generating the compressed block comprises determining whether the size of the block becomes larger than the predetermined size whenever the original column is input.

17. The data compression method of claim 16, further comprising:
    generating the local compressed data or the global compressed data corresponding to the original column input until now as the compressed block in case that the size of the block becomes larger than the predetermined size in determining whether the size of the block stored.

18. The data compression method of claim 13, wherein the selecting the local target comprises updating the local target whenever the original column is input.

* * * * *